United States Patent [19]
Baker et al.

[11] Patent Number: 5,952,241
[45] Date of Patent: Sep. 14, 1999

[54] METHOD AND APPARATUS FOR IMPROVING ALIGNMENT FOR METAL MASKING IN CONJUCTION WITH OXIDE AND TUNGSTEN CMP

[75] Inventors: Daniel Claire Baker, Milpitas; Charles Franklin Drill, Boulder Creek; Milind Ganesh Weling, San Jose, all of Calif.

[73] Assignee: VLSI Technology, Inc., San Jose, Calif.

[21] Appl. No.: 08/923,106

[22] Filed: Sep. 3, 1997

[51] Int. Cl.$^6$ .................................................. H01L 21/302
[52] U.S. Cl. ........................... 438/691; 438/692; 438/694
[58] Field of Search ..................................... 438/690, 691, 438/692, 694

[56] References Cited

U.S. PATENT DOCUMENTS

| | | | |
|---|---|---|---|
| 5,401,691 | 3/1995 | Caldwell | 438/692 |
| 5,503,962 | 4/1996 | Caldwell | 430/317 |
| 5,614,446 | 3/1997 | Ramaswami et al. | 437/228 |
| 5,627,110 | 5/1997 | Lee et al. | 438/692 |
| 5,783,490 | 7/1998 | Tseng | 438/692 |

Primary Examiner—Benjamin Utech
Assistant Examiner—Kin-Chan Chen
Attorney, Agent, or Firm—Wells, St. John, Roberts, Gregory & Matkin, P.S.

[57] ABSTRACT

A semiconductor wafer polishing method comprises forming at least one alignment mark within an alignment area on a semiconductor wafer, forming a layer to be polished over the wafer, the layer being formed to be generally elevationally higher proximately about and surrounding the alignment area than within the alignment area, and polishing the layer. According to another aspect, a semiconductor wafer includes an alignment marking area formed relative to a surface of the wafer. At least one alignment mark is provided within the alignment area. A structure is formed about the alignment marking area and extends from the wafer surface a greater elevation than any elevation from such surface from which the alignment mark extends. Furthermore, a layer of material to be polished is provided over the structure to cause the material to be polished to be elevationally higher over the structure than over the alignment mark.

30 Claims, 5 Drawing Sheets

METHOD AND APPARATUS FOR IMPROVING ALIGNMENT FOR METAL MASKING IN CONJUCTION WITH OXIDE AND TUNGSTEN CMP

TECHNICAL FIELD

The present invention relates to semiconductor wafer processing, and more particularly to a method and apparatus that preserves alignment targets when planarizing a wafer during chemical mechanical polishing.

BACKGROUND OF THE INVENTION

Recent developments in the field of semiconductor wafer fabrication have led to advancements in the size reduction of devices present on die of a semiconductor wafer. Such advancements have lead to increasing density of circuit elements in the die structure. As feature sizes and devices become smaller, there is a need to more precisely align the photolithographic masks with the wafer during masking steps, minimizing misalignment between layers.

A typical alignment technique will require the use of alignment targets that are defined on a wafer layer preceding the layer to be deposited. With recent microcircuit devices of semiconductor wafers, a large number of patterns are deposited in multiple layers comprising patterned regions of insulative, conductive and differing conductivity materials. For multiple layers, where successive metallized layers are separated by an insulation layer such as an oxide layer, there is a need to align the topography of each layer over the previous layers.

One way involves the use of alignment patterns comprising an array of alignment markings that are defined on the wafer on each previous layer. In order to ensure alignment between successive layers, it becomes necessary to replicate the positioning of the alignment markings from one layer to the next. The placement of successive circuit structures, in layers, is dependent on the precise placement of a photolithographic mask and the alignment markings on the previous layer.

Another way involves the use of alignment patterns comprising alignment marks, or markings, that are defined on the wafer on an original base layer, with all subsequent layers being aligned with respect to these alignment marks.

In order to fabricate integrated circuit structures on a wafer, a series of metallized and insulative layers are formed successively on the wafer, with the aid of alignment markings. Typically, each pair of metallized layers is separated by an insulative layer such as an oxide layer. The use of alignment markings when depositing the layers ensures alignment between layers, enabling replication of a desired topography from layer to layer.

One such system uses a step-and-repeat aligner with a reticle, or partial mask for a single chip, to form each individual die on a wafer, successively across the wafer. Individual fields are mapped across a face of the wafer for receiving a dedicated die. Each field receives a dedicated alignment marking for aligning the die within the field.

In order to prevent flaws or discontinuities in overlying metallized layers of each die, it is desirable to planarize the underlying surface of the die to make it as flat as possible. In practice, the entire wafer surface is planarized prior to depositing a metallized layer onto each of the die on the wafer face. Typically, the layer being planarized comprises an insulative layer.

One presently favored planarization technique is chemical mechanical polishing (CMP). More particularly, chemical mechanical polishing is being widely accepted as the preferred process for planarizing dielectrics and subsequently tungsten (W) plugs. One particular use has been in the manufacture of 0.25 micrometer (and smaller) features. It has been found that process performance for oxide and tungsten chemical mechanical polishing can depend on the underlying patterns of the wafer being polished.

For cases where an array of vias (filled or unfilled) are present, or where underlying patterns are not present, dishing of the oxide layer being polished can occur. Dishing refers to the difference in elevation of oxide remaining for areas with and without underlying topography, or features. For the case of oxide chemical mechanical polishing, the oxide layer present over topography within the wafer is being planarized. The amount, or depth, of planarization is found to decrease as the distance from the underlying topography increases. Hence, it has been found in practice that the local oxide erosion rate is variable, and is dependent on the proximity to underlying features within the wafer. In close proximity with and above the underlying features, the amount of dishing is found to be minimized.

One problem with dishing is the damage that can occur to alignment targets which can potentially cause an inability to properly align subsequent layers on a die being deposited atop a wafer.

Therefore, there is a need to provide a method for minimizing the effects of dishing when preparing a wafer by way of chemical mechanical polishing. Furthermore, a need remains for alignment targets which better withstand any local erosion from occurring via dishing during chemical mechanical polishing which might otherwise erode alignment marks of an alignment target.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

According to one aspect of the invention, a semiconductor wafer polishing method comprises forming at least one alignment mark within an alignment area on a semiconductor wafer, forming a layer to be polished over the wafer, the layer being formed to be generally elevationally higher proximately about and surrounding the alignment area than within the alignment area, and polishing the layer.

According to another aspect of the invention, a semiconductor wafer includes an alignment marking area formed relative to a surface of the wafer. At least one alignment mark is provided within the alignment area. A structure is formed about the alignment marking area and extends from the wafer surface a greater elevation than any elevation from such surface from which the alignment mark extends. Furthermore, a layer of material to be polished is provided over the structure to cause the material to be polished to be elevationally higher over the structure than over the alignment mark.

Figure 1B:
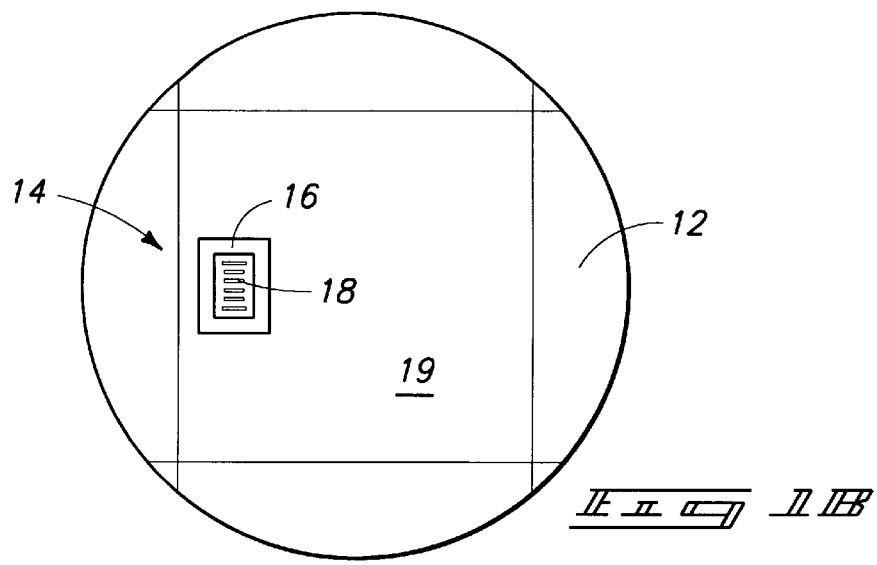
FIG. 1B is an enlarged top view of one field provided on the wafer of FIG. 1A and including an improved alignment target of this invention.
Figure 1A:
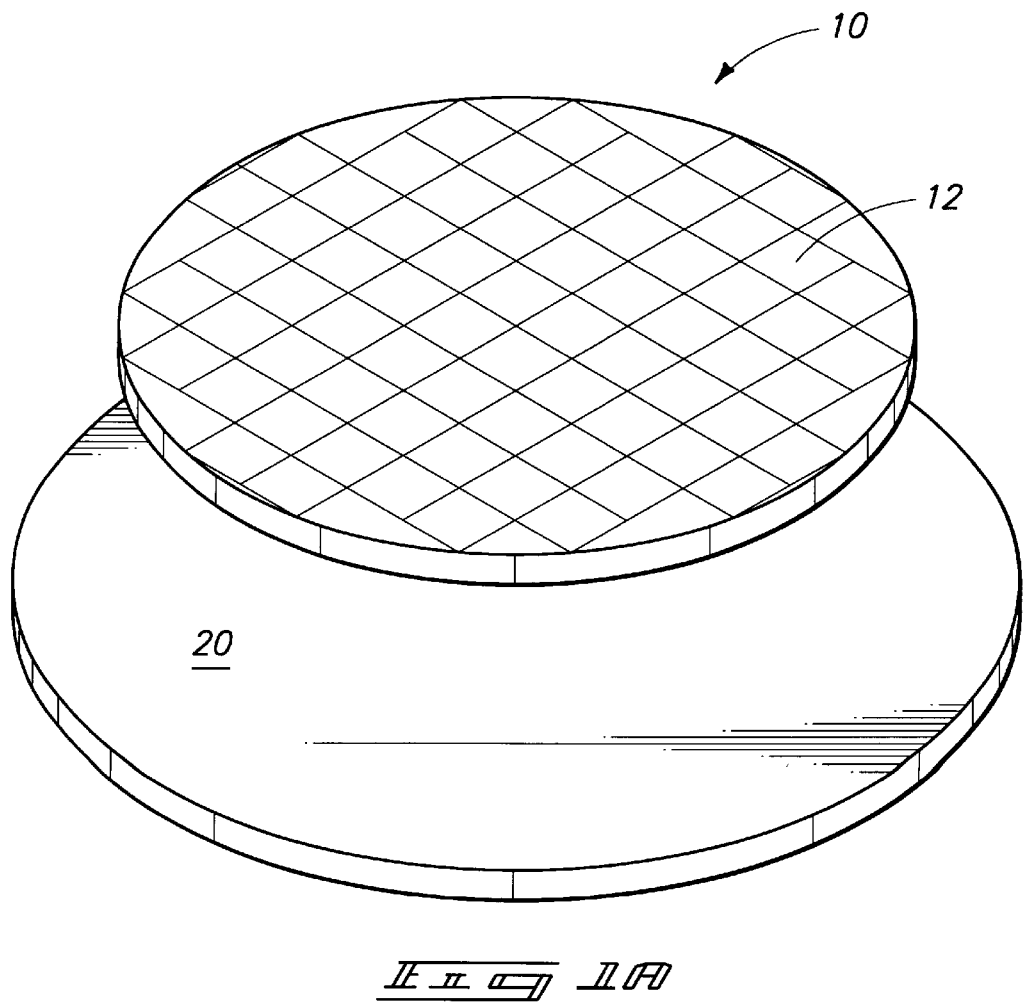
FIG. 1A is a perspective view of a semiconductor wafer and holding apparatus, the wafer having a series of alignment targets for use with a metal deposition system.

Referring now to FIGS. 1A and 1B, a typical semiconductor wafer 10 is shown with a top surface 12 subdivided into a plurality of fields 19, each forming an individual die for receiving circuitry (not shown) via a metal deposition process. Each field 19 contains a dedicated alignment target 14 surrounded by topography in the form of an encircling frame 16. Encircling frame 16 is configured to surround alignment target 14. Alignment target 14 comprises an alignment marking in the form of a plurality of marks, or metal filled trenches, 18. Individual marks 18 of target 14 are configured in adjacent spaced apart relation to form such an alignment marking. The alignment target is operative to be read by a laser alignment beam of a wafer stepper during a masking step of a photolithographic process.

Wafer 10 is shown in FIG. 1A prior to being mounted on top of a wafer retainer 20 of a metal deposition system. Wafer retainer 20 is shown in simplified form, the particulars of its construction being of little or no consequence to the implementation of the invention. According to one typical construction, retainer 20 includes a mounting surface comprising mounting protrusions (not shown) and a clamping ring (not shown) for securing wafer 10 on top of retainer 20. One suitable metal deposition system is a physical vapor deposition system which is well known in the art. According to this system, wafer 10 is mounted on top of retainer 20 and enclosed within a processing chamber that is filled with a low pressure gas, such as argon. The argon gas is used to dislodge atoms from a target region of the material which is to be deposited onto wafer 10. The target region of material is also contained within the processing chamber.

One or more alignment target 14 is typically used to position wafer 10 within a metal deposition system, as shown in FIG. 1B. Additionally, one or more alignment target 14 is used by a wafer stepper to align a mask with the wafer. To perform the alignment, a laser alignment beam is generated by a wafer stepper during a masking step of a photolithographic process. Individual alignment marks 18 of an alignment target 14 diffract light that is received from the laser. The diffracted light is then detected, enabling the stepper to detect the position of alignment target 14 and wafer 10, thereby enabling accurate alignment of the mask with the wafer. In one instance, the mask comprises a single reticle of a single chip for use with a step-and-repeat aligner.

Figure 2:
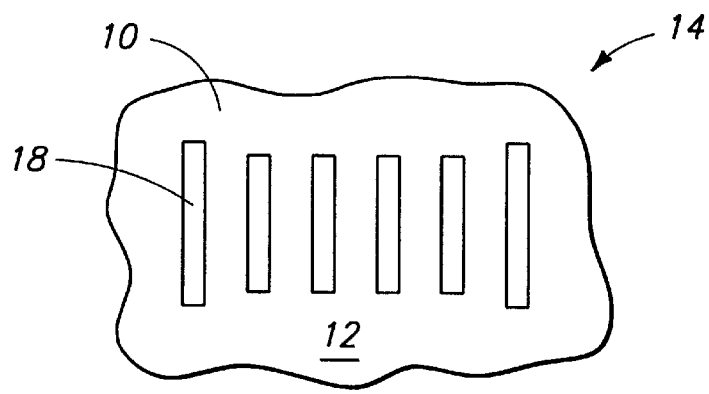
FIG. 2 is an enlarged top view of a related art alignment target usable to align photolithographic masks on previous layers of a wafer.

FIG. 2 illustrates one prior art alignment target 14 comprising a plurality of elongated, parallel alignment marks 18. Each alignment mark 18 comprises a metal-filled via formed within an oxide layer. Such marks 18 are viewable from a top surface 12 of a semiconductor wafer 10 by a wafer stepper alignment device. According to this embodiment, a total of six substantially parallel alignment marks form target 14, with each end mark being sized slightly larger in length.

Figure 5:
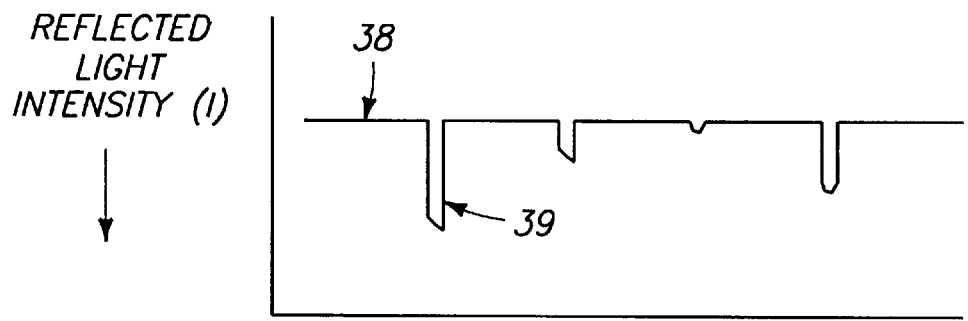
FIG. 5 is a typical output waveform from a stepper alignment system used to detect an alignment target such as the alignment target of FIG. 2, but when it is suffering the effects of dishing.

Alignment target 14 of FIG. 2 illustrates one typical alignment target construction that is susceptible of dishing during chemical mechanical polishing. It has been discovered that the absence of any topography, in the form of underlying features, within the wafer and proximate alignment marks 18 tends to increase the effect of dishing over target 14. In some cases, dishing of target 14 can result in diminution of marks 18 to such an extent that a wafer stepper will not be able to properly discern the location of target 14. FIG. 5, as discussed below, illustrates a typical wafer stepper laser output from a target 14 that has been eroded from dishing to such an extent that recognition with a wafer stepper is greatly hindered. As a result, accurate positioning of a mask with respect to a wafer can provide difficult if not impossible, leading to a potential decrease in yield of acceptable finished die.

The alignment target 14 presented by alignment marks 18 of FIG. 2 is typical of an alignment marking that is used when accurately depositing metal layers onto a wafer. Marks 18 comprise a series of parallel trenches that are etched into an oxide film of a wafer. A laser alignment beam of a wafer stepper scans marks 18 in order to determine the position of a wafer with respect to a mask. Such a series of marks is vulnerable to the type of dishing illustrated below with reference to FIG. 4. The amount or extent of dishing which results is usually calculated from a flat reference surface that is parallel to the silicon substrate. Dishing may occur during either oxide or tungsten chemical mechanical polishing, and it may affect both oxide and tungsten films which remain on the wafer.

Figure 3:
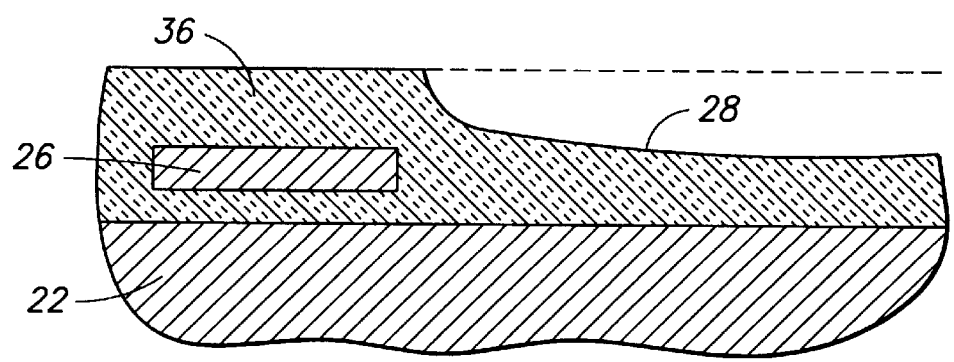
FIG. 3 is a cross section of a wafer having local internal topography and illustrating dishing of an oxide film during chemical mechanical polishing.

FIG. 3 illustrates one configuration of underlying patterns, or topography on a wafer. An associated effect on pattern defects, or erosion, resulting from dishing during chemical mechanical polishing of the oxide layer in locations adjacent but away from the underlying pattern can be seen. More particularly, a bulk substrate region 22 of a wafer supports underlying topography in the form of underlying features such as circuitry 26 embedded within one or more layers of an oxide layer 36. Chemical mechanical polishing of oxide layer 36 results in oxide dishing along surface 28. The tendency for surface 28 to dish can be seen to increase as the distance from underlying topography 26 increases. This tendency for dishing in the oxide to increase, away from topography, can result in undesirable degradation of marks 18 in the alignment target 14 of FIG. 2.

Figure 4:
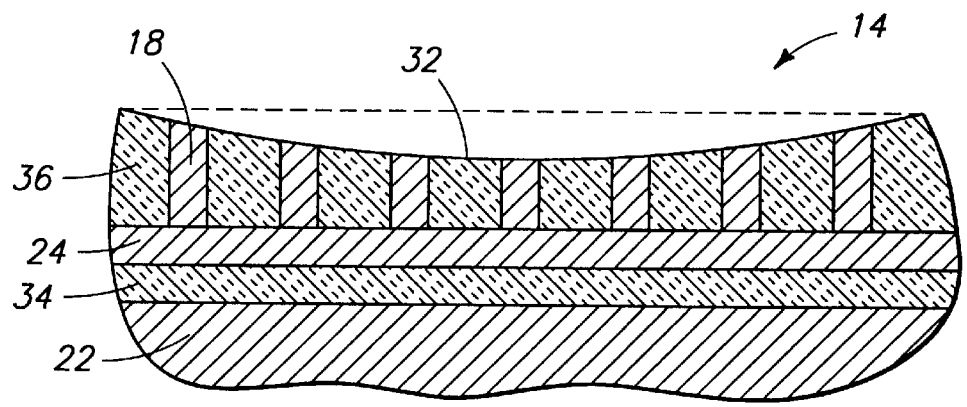
FIG. 4 is a cross section of a wafer having internal topography in the form of a via array and illustrating dishing of an oxide film during chemical mechanical polishing.

FIG. 4 depicts another example of oxide erosion resulting from dishing during chemical mechanical polishing. More particularly, oxide 36 is removed during chemical mechanical polishing at an accelerated rate in regions where there is a discontinuous oxide film 36. One instance where a discontinuous oxide film occurs is a via array formed by metal filled alignment marks 18. As shown in FIG. 4, alignment marks 18 correspond with alignment marks 18 of FIG. 2. Each mark 18 is formed by a metal filled via which conductively mates with a metallized base layer 24. In the construction of FIG. 4, base layer 24 is further isolated from a bulk substrate region 22 of a wafer by an intermediate oxide layer 34. Optionally, base layer 24 and oxide layer 34 can be omitted.

According to the construction of FIG. 4, erosion occurs in the region of marks 18 during chemical mechanical polishing so as to form eroded surface 32. Dishing which occurs as a result of this erosion about the via array has been found to be oxide pattern dependent. Therefore, at any location, the total amount of dishing can be related to a combination of the proximity and the density of the underlying metal pattern, as well as the local oxide pattern density.

FIG. 5 illustrates a typical output waveform signal 38 produced from a stepper alignment system that is being used to detect an eroded alignment target such as alignment target 14 of FIG. 2, but for the case where it is suffering the effects of dishing as shown above in FIG. 4. Each mark 18 (of FIGS. 2 and 4) causes a diffraction pattern from a laser alignment beam which is received and detected by the wafer stepper. Erosion of the alignment target results from chemical mechanical polishing during planarization.

FIG. 5 illustrates a wafer stepper alignment scan line output waveform signal 38 that is eroded from diffraction. Diffraction results when excess erosion deteriorates laser light being diffracted from the alignment marks to such an extent that individual diffraction patterns 39 can not be accurately and repeatedly recognized by a wafer stepper. In contrast, the provision of a protective border comprising a frame 16 has been discovered by Applicants to provide desirable underlying features that protect the alignment target from excess erosion, as described below in further detail with reference to FIG. 6.

Figure 6:
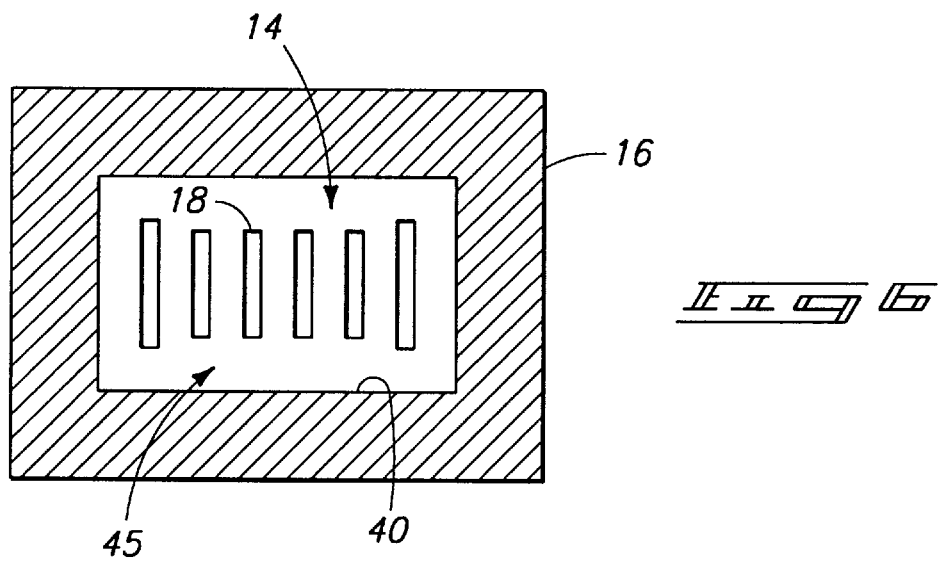
FIG. 6 is a plan view of an improved alignment target of this invention having topography in the form of a protective border or frame encircling the alignment marks.

FIG. 6 illustrates a structure 16 formed about an alignment marking area of an alignment target 40 on a surface 12 of a semiconductor wafer 10 operative to minimize dishing. Structure 16 extends elevationally from a surface 44 (see FIG. 8D) from which each alignment mark 18 extends. Structure 16 is formed as an annular frame extending about alignment marks 18 for the purpose of imparting a protective border about individual alignment marks 18 within the alignment area on a semiconductor wafer. Provision of structure 16 provides a frame, or protective border, that minimizes or reduces local chemical mechanical polishing erosion rate. Hence, identification of alignment target 14 proves more accurate and repeatable, leading to more productive yields of desirable die during wafer processing operations.

According to one construction, frame 16 forms a border about alignment target 14 that has a border width of at least 20 microns width extending from an inner periphery to an outer periphery in a direction transverse to the border. Such a border width is provided along each of the four sides on frame 16. Frame 16 is formed as close as possible to alignment marks 18 without causing any interference with target recognition by a wafer stepper. For the case of a Metal-1 alignment, frame 16 is formed at a Gate layer. For a Metal-2 alignment, frame 16 is formed at a Metal-1 layer. For a Metal-3 alignment, frame 16 is formed at a Metal-2 layer, and so on.

According to the construction of FIG. 6, the dependence of chemical mechanical polishing on underlying features 26 (as illustrated in FIG. 3) is provided by frame 16 so as to protect alignment target 40 from excess erosion. As a result of the incorporation of frame 16 about alignment target 14, an improved waveform signal will be generated from alignment target 14 by a wafer stepper alignment system. Such an improved signal results since erosion from dishing caused by planarization will be minimized, as shown below with reference to FIG. 7.

It is understood that alignment marks 18 can be formed from any of a number of constructions including verniers, vias, and layers of contrasting material having detectable features. Furthermore, any of a number of different shaped marks can be used to form a suitable alignment marking or target.

It is also understood that frame 16 can be formed from any of a number of constructions including a unitary, uninterrupted serpentine border, a series of closely adjacent elements encompassing the alignment marking area, or a series of borders surrounding individual or groups of alignment marks.

Figure 7:
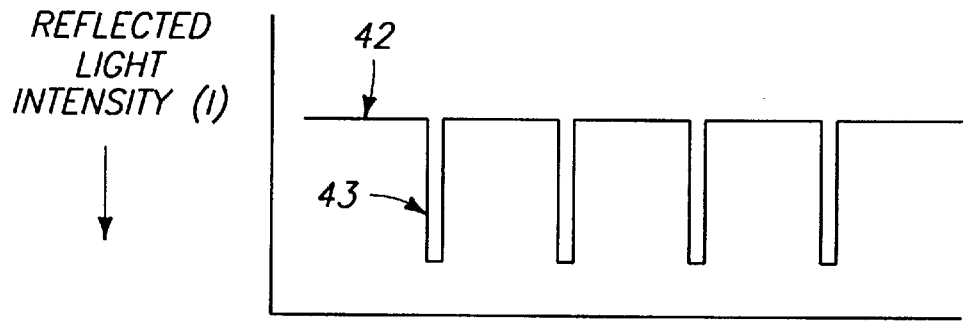
FIG. 7 is a typical output waveform from a stepper alignment system used to detect an improved alignment target of this invention in the form of the alignment target of FIG. 6.

FIG. 7 depicts a typical scan line output waveform signal 42 produced from a stepper alignment system that has been used to detect an improved alignment target construction of this invention in the form of alignment target 14 and frame 16 of FIG. 6. Such an output waveform signal 42 is substantially improved over that of signal 38 (of FIG. 5), allowing better pattern recognition and overlay during metal layer alignment with a stepper alignment system. Individual diffraction patterns 43 are more clearly seen in output signal 42, and will be more easily and accurately detected with a wafer stepper.

FIGS. 8A–8D illustrates in further detail the construction of alignment target 40 and frame 16 of FIG. 6. According to FIG. 8A, frame 16 comprises a structure formed on a surface 44 of a bulk substrate region 22 on a wafer. Frame 16 is configured to extend about alignment marks 18 (see FIGS. 8C and 8D) once they are formed within the alignment marking area. Hence, frame 16 comprises a circumferentially extending frame encircling the alignment marks. Frame 16 extends elevationally from surface 44 from which alignment marks 18 (FIGS. 8C and 8D) will also extend once they have been formed. Optionally, frame 16 can be formed as a series of raised structures provided in adjacent spaced-apart relation about the alignment marks and extending elevationally from a lowermost portion of the alignment marks.

Figure 8:
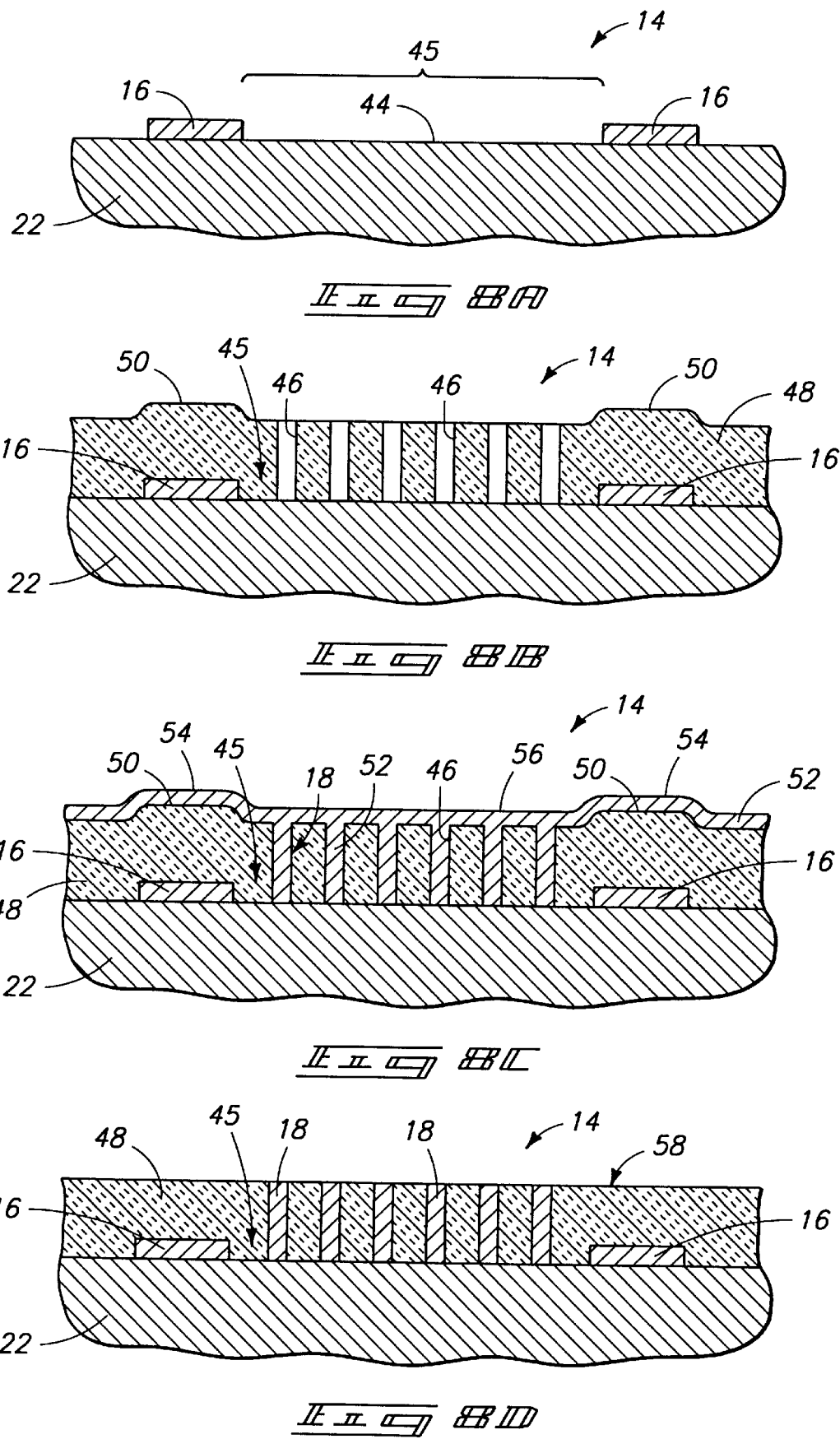
FIGS. 8A, 8B, 8C, and 8D are cross sectional views of the sequence of processing steps illustrating the formation of the alignment target of FIG. 6 in accordance with the present invention to preserve alignment targets when a chemical mechanical planarization process is used.

According to a semiconductor wafer polishing method depicted in FIG. 8B, an oxide layer 48 is formed over structure 16 and bulk substrate region 22. Layer 48 is formed so as to be generally elevationally higher proximately about and surrounding an alignment area 45 of alignment target 14 than within alignment area 45. Alignment area 45 comprises an alignment marking area. According to this construction, vias 46 are constructed in the form of grooves, or trenches, and are provided in oxide layer 48 during forming. Alternatively, vias, or trenches, 46 can be etched into layer 48 after depositing layer 46. Layer 48 is subsequently planarized by chemical mechanical polishing (see FIG. 8C), after a metal layer 56 has been deposited over oxide layer 48 and within vias 46 (see FIG. 8D). Alternatively, layer 56 can be formed from any material having discernible contrasting features over those of oxide layer 48 and that are detectable by an alignment system such as a wafer stepper alignment system. For the case of a wafer stepper alignment system, the contrasting feature comprises differing laser light diffraction properties for metal layer 56 and oxide layer 48.

As shown in FIG. 8B, oxide layer 48 provides a layer over bulk substrate region 22 of the wafer that is to be polished. Oxide layer 48 is formed to be generally elevationally higher proximately about and surrounding the alignment area 45 than within alignment area 45 due to frame 16. Once deposited, oxide layer 48 forms a raised portion 50 immediately above and proximate frame 16. Raised portion 50 is deposited on bulk substrate region 22 so as to encompass alignment marking area 45. Oxide layer 48 is polished following deposition of metal layer 52 (see FIGS. 8C and 8D).

FIG. 8C depicts formation of alignment target 14 and frame 16 after depositing a metal layer 52 over the removable oxide layer 48 and within trenches 46. Metal layer 52 is deposited with a metal deposition system using a sputtering technique such as physical vapor deposition. Metal layer 52 forms a raised metal structure 54 over raised portion 50 of oxide layer 48. A lower metal layer 56 is encircled by raised metal structure 54. Metal layer 52 and alignment mark 18 comprise tungsten metal in one embodiment. Accordingly, tungsten metal layer 52 fills trenches 46 such that, after planarization via chemical mechanical polishing, a wafer stepper can readily discern laser light diffraction from marks 18. Accordingly, marks 18 are formed from a material that contrasts with surrounding oxide layer 48 which enables detection via optical, x-ray or whatever means that are suitable to locate alignment target 14.

FIG. 8D depicts a wafer following planarization via chemical mechanical polishing. A planarized top surface 58 of a wafer results in exposure of alignment targets 18, as shown in plan view in FIG. 6, with frame 16 contributing to minimize erosion of individual marks 18. Hence, the specific features of marks 18 are protected from dishing as a consequence of frame 16 being provided adjacent marks 18, and oxide layer 48 being substantially continuous along surface 58, except for marks 18. By chemical mechanical polishing to expose surface 58, alignment marks 18 of contrasting material are discernible from oxide layer 48 when subjected to a wafer alignment beam of a wafer stepper.

Figure 9:
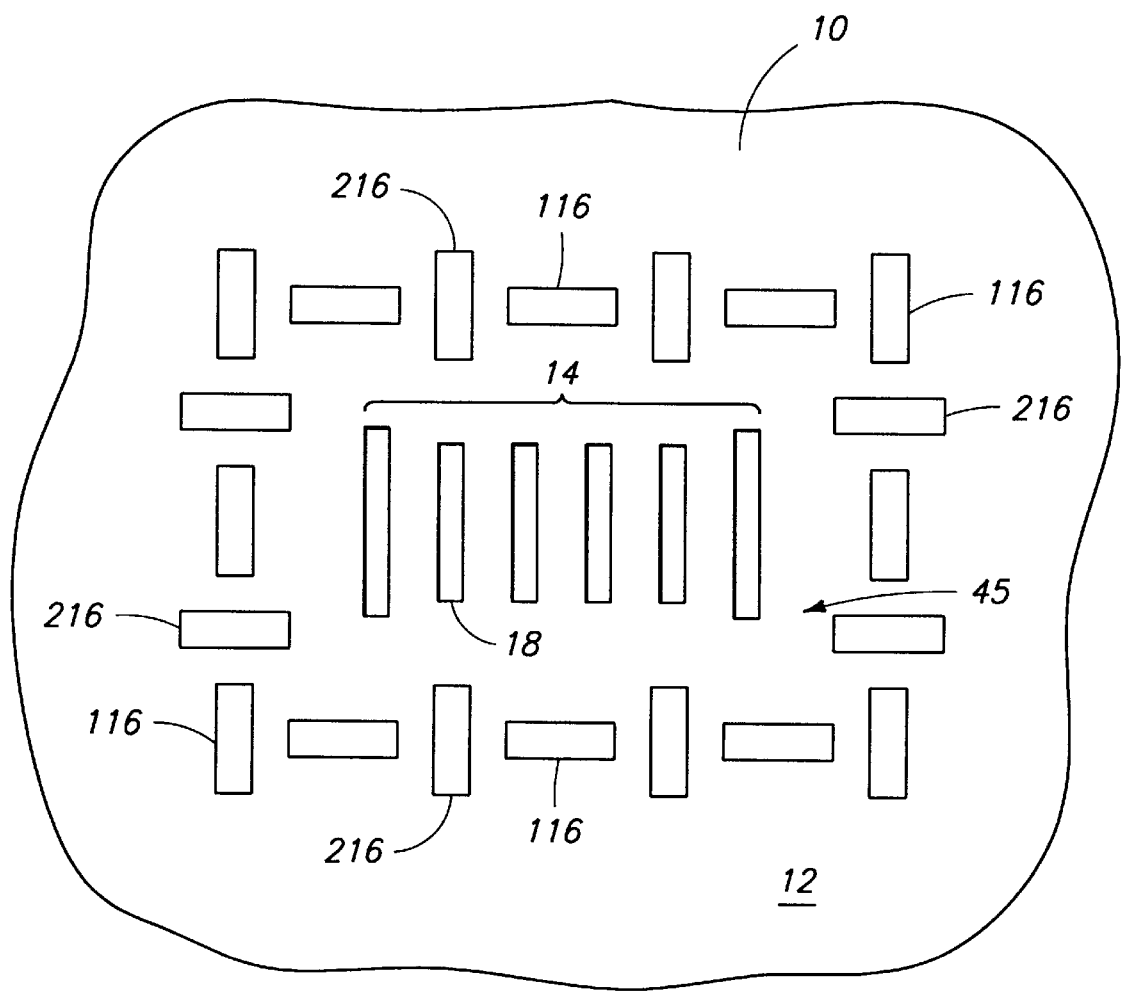
FIG. 9 is a plan view of an alternatively constructed improved alignment target of this invention having topography in the form of a protective border or frame of discrete frame segments which encircle the alignment marks.

FIG. 9 illustrates one alternatively constructed alignment target configuration wherein alignment target 14 is encircled by a structure comprising a series of raised structures, or frame segments, 116 and 216 formed about alignment marking area 45. Frame segments 116 and 216 each comprise a structure of neighboring adjacent frame segments. Frame segments 116 and 216 each extend from the wafer surface a greater elevation than any elevation from such surface from which alignment marks 18 extend. As was the case with frame 16 in FIGS. 8A–D, a layer of material to be polished is provided over frame segments 116 and 216 to cause the material to be polished to be elevationally higher over frame segments 116 and 216 than over the alignment marks 18. Frame segments 116 and 216 are arranged in proximately and adjacent spaced-apart relation about alignment marking area 45. Frame segments 116 and 216 each comprise a rectangular element, with adjacent frame segments 116 and 216 being oriented with the major axis of adjacent segments perpendicular to one another. Alternatively, frame segments 116 and 216 can comprise any suitable geometry such as circular, elliptical, ribbon shaped, or serpentine so long as the segments cooperate to encompass, or encircle, the alignment mark.

Optionally, frame segments 116 and 216 can be arranged in any orientation that encompasses the alignment marking area, and is in close proximity with the alignment marks. For example, any of a number of differently shaped bumps, dimples, or elevated structures suitable for encircling alignment marks and operable to minimize dishing will prove suitable.

It is to be understood that alignment target 14 of FIGS. 1, 6 and 9 can be used repeatedly by using the alignment target to step and repeat a pattern on the wafer. Optionally, a new alignment target can be deposited over the previous alignment target in preparation for aligning and depositing a subsequent layer.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor wafer polishing method comprising:
   forming at least one alignment mark within an alignment area on a semiconductor wafer;
   forming a raised structure provided to encompass the alignment mark;
   forming a layer to be polished over the wafer, the layer provided generally elevationally higher above the raised structure than within the alignment area; and
   polishing the layer.

2. The semiconductor wafer polishing method of claim 1 wherein the alignment mark comprises a tungsten metal filled trench.

3. The semiconductor wafer polishing method of claim 1 wherein the alignment mark comprises an elongate metal filled via.

4. The semiconductor wafer polishing method of claim 1 wherein the raised structure comprises a series of raised structures provided in adjacent spaced-apart relation about the alignment mark and extending elevationally from a lowermost portion of the alignment mark.

5. The semiconductor wafer polishing method of claim 1 wherein the step of polishing the layer comprises chemical mechanical polishing.

6. A semiconductor wafer polishing method comprising:
   forming at least one alignment mark within an alignment area on a surface of a semiconductor wafer;
   forming a structure that is provided about the alignment mark having a thickness that extends elevationally from the surface from which the alignment mark extends;
   forming a layer to be polished over the structure, the layer being formed to be generally elevationally higher above the structure than within the alignment area; and
   polishing the layer.

7. The semiconductor wafer polishing method of claim 6 wherein the step of forming at least one alignment mark comprises the step of forming a plurality of alignment marks in the form of an alignment target.

8. The semiconductor wafer polishing method of claim 6 wherein the structure comprises a circumferentially extending frame encircling the alignment mark.

9. The semiconductor wafer polishing method of claim 6 wherein the structure comprises a series of raised structures provided in adjacent spaced-apart relation about the alignment mark and extending elevationally from a lowermost portion of the alignment mark.

10. The semiconductor wafer polishing method of claim 6 further comprising the step of forming a contrasting metal layer on the layer to be polished.

11. The semiconductor wafer polishing method of claim 6 wherein the step of forming at least one alignment mark comprises providing an alignment trench within the layer to be polished and filling the alignment trench with metal.

12. A semiconductor wafer polishing method comprising:
   forming at least one alignment mark within an alignment area on a semiconductor wafer;
   forming a series of raised structures in adjacent spaced-apart relation that are provided about the alignment mark having a thickness that extends elevationally from a lowermost portion of the alignment mark;
   forming a layer to be polished over the raised structures, the layer being formed to be generally elevationally higher above the structures than within the alignment area; and
   polishing the layer.

13. The semiconductor wafer polishing method of claim 12 wherein the series of raised structures comprises a plurality of neighboring adjacent frame segments.

14. The semiconductor wafer polishing method of claim 13 wherein each frame segment comprises a rectangular element, and adjacent alternating rectangular elements are arranged with perpendicular major axes.

15. The semiconductor wafer polishing method of claim 12 wherein the raised structures comprise an array of adjacent frame segments encircling the alignment mark.

16. The semiconductor wafer polishing method of claim 12 wherein the step of forming a series of raised structures comprises depositing metal on the wafer.

17. The semiconductor wafer polishing method of claim 12 further comprising the step of using the alignment target to step and repeat a pattern on the wafer.

18. A semiconductor wafer polishing method comprising:
   preparing a semiconductor substrate having a surface including an alignment marking area;
   depositing a raised portion on the surface to encompass the alignment marking area;
   depositing a removable layer over the wafer including over the raised portion and the alignment marking area;
   providing alignment trenches within the removable layer and within the alignment marking area to form alignment trenches;
   depositing a contrasting layer on the removable layer and within the alignment trenches; and
   chemical-mechanical polishing to remove the contrasting layer deposited over the removable layer and expose alignment marks comprising the contrasting layer deposited within the alignment trenches.

19. The semiconductor wafer polishing method of claim 18 wherein the step of providing alignment trenches within the removable layer comprises the step of etching alignment trenches within a portion of the removable layer within the alignment marking area.

20. The semiconductor wafer polishing method of claim 18 wherein the step of providing alignment trenches within the removable layer comprises the step of forming the removable layer so as to have elongate alignment trenches.

21. The semiconductor wafer polishing method of claim 18 wherein the removable layer comprises an electrically insulative material and the contrasting layer comprises an electrically conductive material.

22. The semiconductor wafer polishing method of claim 18 wherein the removable layer comprises an oxide layer and the contrasting layer comprises tungsten metal.

23. The semiconductor wafer polishing method of claim 18 wherein the raised portion comprises a continuous annular frame of topography encircling the alignment mark and underlying the removable layer.

24. The semiconductor wafer polishing method of claim 18 wherein the raised portion comprises a plurality of adjacent frame segments of topography encircling the alignment mark and underlying the removable layer.

25. A method for improving alignment for metal masking with an oxide and tungsten chemical-mechanical polishing planarization process comprising the following steps:
   preparing a semiconductor substrate having a surface including an alignment marking area;
   depositing a raised portion on the surface to encompass the alignment marking area;
   depositing a removable oxide layer over the wafer including over the raised portion and the alignment marking area;
   forming alignment trenches in a portion of the removable layer within the alignment marking area;
   depositing a contrasting tungsten layer on the removable layer and within the alignment trenches; and
   chemical-mechanical polishing to remove the contrasting layer deposited over the removable layer and expose alignment marks comprising the tungsten layer deposited within the alignment trenches of the oxide layer.

26. The method of claim 25 wherein the raised portion comprises a circumferentially continuous raised annular portion extending entirely around the alignment marking area.

27. The method of claim 25 wherein the raised portion comprises a plurality of elongated raised portions encompassing the alignment marking area.

28. The method of claim 25 wherein the step of forming alignment trenches in a portion of the removable layer comprises removing a portion of the removable layer to form alignment trenches.

29. The method of claim 25 wherein the step of forming alignment trenches in a portion of the removable layer comprises depositing the removable oxide layer to form alignment trenches.

30. The method of claim 25 wherein the raised portion comprises a discontinuous frame encompassing the alignment marking area.

* * * * *